(12) United States Patent
Tsuchinaga (10) Patent No.: US 7,159,166 B2
(45) Date of Patent: Jan. 2, 2007

(54) ERROR CORRECTION METHOD, ERROR CORRECTION CIRCUIT AND INFORMATION-RECORDING/REPRODUCTION APPARATUS

(75) Inventor: Hiroyuki Tsuchinaga, Fujisawa (JP)

(73) Assignee: Hitachi Global Storage Technologies Japan, Ltd., Odawara (JP)

( * ) Notice: Subject to any disclaimer, the term of this patent is extended or adjusted under 35 U.S.C. 154(b) by 522 days.

(21) Appl. No.: 10/666,001

(22) Filed: Sep. 17, 2003

(65) Prior Publication Data
US 2004/0153946 A1   Aug. 5, 2004

(30) Foreign Application Priority Data
Jan. 30, 2003   (JP) ............... 2003-021458

(51) Int. Cl.
H03M 13/15 (2006.01)
G11B 20/18 (2006.01)
(52) U.S. Cl. .............. 714/781; 714/769; 714/770; 714/771; 714/784
(58) Field of Classification Search ........ 714/769–771, 714/780–781, 784
See application file for complete search history.

(56) References Cited

U.S. PATENT DOCUMENTS 4,843,607 A * 6/1989 Tong ................. 714/784

FOREIGN PATENT DOCUMENTS

| JP | 2000134114 A | 5/2000 |
| JP | 2000057709 A | 12/2002 |

* cited by examiner

*Primary Examiner*—R. Stephen Dildine
(74) *Attorney, Agent, or Firm*—Townsend and Townsend and Crew LLP

(57) ABSTRACT

An error correction method is provided as follows: handling a 2-event error generated very frequently as an object of correction; sequentially finding CRC data for a generated event of an error handled as the defined object of correction at any arbitrary bit position of reproduced data by implementation of a cyclic-replacement process; carrying out an exclusive-addition process of the CRC data to CRC data of the reproduced data in order to virtually carry out a tentative-correction process on a 1-event error at a first bit position; further finding CRC data generated after the tentative-correction process in order to detect a 1-event error at a second bit position; and correcting the 1-event error completing the tentative-correction process at the first position and the 1-event error at the second bit position.

9 Claims, 6 Drawing Sheets

ERROR CORRECTION METHOD, ERROR CORRECTION CIRCUIT AND INFORMATION-RECORDING/REPRODUCTION APPARATUS

CROSS-REFERENCES TO RELATED APPLICATIONS

This application claims priority to Japanese application No. 2003-021458, filed Jan. 30, 2003, the disclosure of which is incorporated by reference.

BACKGROUND OF THE INVENTION

1. Field of the Invention

The present invention relates to an error correction technology using cyclic codes. In particular, the present invention relates to an error correction method and an error correction circuit, which are used for correcting 2-event errors generated in reproduced data, as well as relates to an information-recording/reproduction apparatus employing the error correction circuit.

2. Description of Related Art

Figure 2:
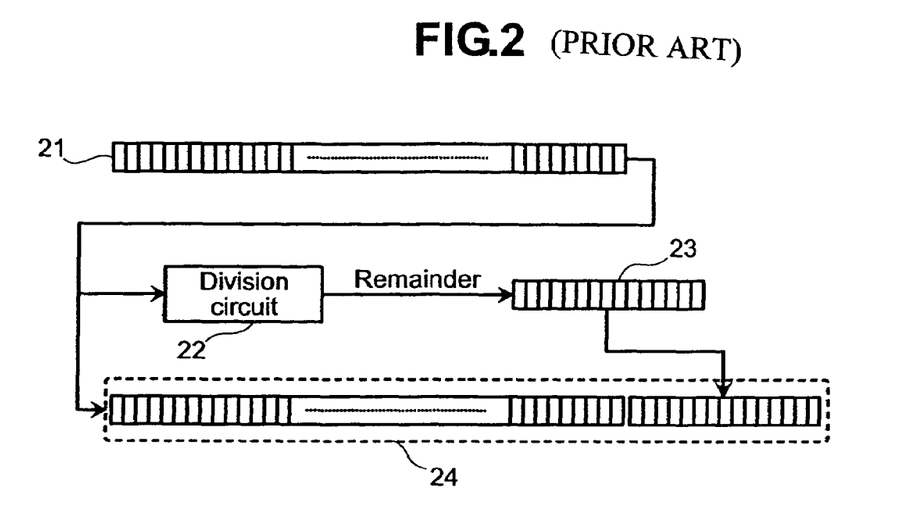
FIG. 2 is an explanatory diagram showing an encoding method using cyclic codes.

In order to detect an error generated in reproduced data, cyclic codes are used in a wide range of applications. A procedure for encoding data by using a cyclic code is shown in FIG. 2. A recording data sequence 21 is supplied to a division circuit 22 for dividing the recording data sequence 21 by a generating function, which is not shown in the figure. A remainder obtained as a result of the division is output from the division circuit 22 as a data sequence 23. The data sequence 23 is referred to as CRC (Cyclic Redundancy Check) data. The CRC data 23 is added to the tail of the recording data sequence 21 to produce an encoded recording data sequence 24. The encoded recording data sequence 24 is obviously divisible by the generating function. Thus, by checking the CRC data obtained as a result of a dividing the encoded recording data sequence 24 by using the division circuit 22 after operations to record and reproduce the encoded recording data sequence 24, it is possible to form a judgment as to whether or not an error has been generated in the reproduced encoded recording data sequence 24.

A conventional technology for correcting errors by using cyclic codes is described in Japanese Published Application No. 2000-57709 (Pages 3 to 4 and FIGS. 1 and 5). An example of applying this technology to signal processing carried out by a magnetic-disc apparatus is explained by referring to FIG. 7. A magnetic-disc apparatus (HDD) 1 comprises a head/disc assembly (HDA) 7 and a package board (PCB) 14. The HDA 7 includes a magnetic disc 2, a spindle motor 6, a magnetic head 3, a carriage 4 and a R/W-IC 5. The magnetic disc 2 is mounted on the spindle motor 6 for rotating the magnetic disc 2. The carriage 4 supports the magnetic head 3 and positions the magnetic head 3 at any arbitrary radial location of the magnetic disc 2. The R/W-IC 5 is attached to the carriage 4. The PCB 14 has read/write channels 8, a 1-event CRCC correction circuit 15, a hard disc controller (HDC) 9, a servo control circuit 10, a microprocessor (MPU) 11, a ROM 12 and a RAM 13.

Figure 7:
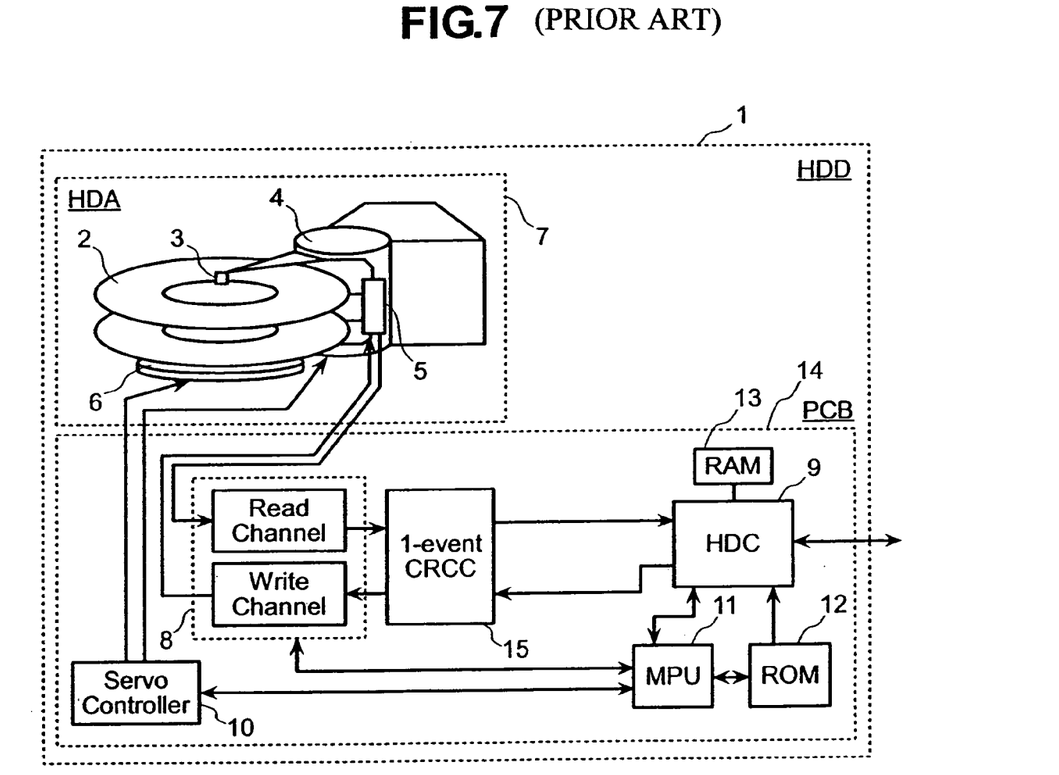
FIG. 7 is a diagram showing the configuration of a prior art magnetic disc apparatus.

The read/write channels 8 comprise a write channel for recording data and a read channel for reproducing data. A signal-processing technology adopted by the read channel is based on a PRML (Partial Response Maximum Likelihood) technique. It is known that a short error of the order of several bits is generated in a single event in data reproduced by adoption of the PRML technique. In accordance with the conventional technology disclosed in patent reference 1, (Japanese Published Application No. 2000-057709), the 1-event CRCC correction circuit 15 for generating cyclic codes is provided between the read/write channels 8 and the hard disc controller 9 so as to allow a 1-event error (that is, an error generated in a single event) to be corrected. A cyclic code that can be used for correcting an error is called a CRCC (Cyclic Redundancy Check Code) and a technique for correcting an error by using a CRCC is known as a CRCC correction technique. The 1-event CRCC correction circuit 15 carries out a CRCC encoding process and corrects a 1-event error.

On the other hand, Japanese Published Application No. 2000-134114 (Pages 6 to 9 and FIGS. 1, 4 and 5) discloses a technology for improving the power to correct an error by using a CRCC on the basis of reliability information obtained in a process of demodulating data reproduced by adoption of the PRML technique. In accordance with the technology, in the case of reproduced data with reliability lower than a threshold value, an extinction error is determined to have been generated. In this case, an extinction flag is set at the location of the extinction error and, by carrying out a CRCC correction process on a sequence obtained as a result of performing tentative-correction processing based on a flexible criterion for the reproduced data on the basis of the extinction flag, a 2-or-more-event error can be corrected.

The extinction flag based on the information on reliability is sensitive to the setting of the criterion threshold value. To be more specific, if the threshold value is set at an excessively large number, the extinction flags will be no longer set. If the threshold value is set at an excessively small number, on the other hand, a number of extinction flags will be set. Thus, it is practically difficult to obtain an accurate extinction flag for each bit unit in a stable manner. In addition, in implementing the CRCC correction technique, a correction processing circuit is required for each data sequence completing a tentative-correction process. Therefore, the circuit scale will inevitably increase.

SUMMARY OF THE INVENTION

Embodiments of the present invention are directed to an error correction method and an error correction circuit, which are capable of implementing the CRCC correction technique for 2-event errors by using a small circuit scale in comparison with the conventional technology while tolerating inaccurateness of extinction flags.

Embodiments of the present invention are also directed to a highly reliable information-recording/reproduction apparatus employing the error correction circuit.

Embodiments of the present invention implements a CRCC technique that can be adopted for correcting a 2-event error by utilization of the following means.

In the first place, the error correction method comprises the steps of: handling a 2-event error generated very frequently as an object of correction; sequentially finding CRC data for a generated event of an error handled as the defined object of correction at any arbitrary bit position of reproduced data by implementation of a cyclic-replacement process; carrying out an exclusive-addition process of the CRC data to CRC data of the reproduced data in order to virtually carry out a tentative-correction process on a 1-event error at a first bit position; further finding CRC data generated after the tentative-correction process in order to detect a 1-event error at a second bit position; and correcting the 1-event error completing the tentative-correction process at the first bit position and the 1-event error at the second bit position.

In the second place, the error correction method further comprises the steps of: identifying a bit range, for which a probability of the existence of a generated error is high, on the basis of information on reliability; and concurrently carrying out CRC correction processes on 2-event errors on the basis of CRC data found after a tentative-correction process carried out virtually for the bit range.

DESCRIPTION OF REFERENCE NUMERALS

1 . . . Magnetic disc apparatus, 2 . . . Magnetic disc, 3 . . . Magnetic head, 4 . . . Carriage, 5 . . . R/W-IC, 6 . . . Spindle motor, 7 . . . Head disc assembly, 8 . . . Read/write channels, 9 . . . Hard disc controller, 10 . . . Servo control circuit, 11 . . . Microprocessor, 12 . . . ROM, 13 . . . RAM, 14 . . . Package board, 15 . . . 1-event CRCC correction circuit, 16 . . . 2-event CRCC correction circuit, 17 . . . , Reliability information, 21 . . . Recording-data sequence, 22 . . . Division circuit, 23, 33 and 43 . . . CRC data, 24 . . . Encoded recording-data sequence, 31, 42, 49, 57, 58 and 59 . . . Linear feedback shift registers, 32 . . . - - - Input data, 34 . . . Preset data, 41 . . . PRML demodulator, 44 . . . Multiplier, 45 . . . Beta matrix, 46 . . . Error detection circuit, 47 . . . Error correction signal, 48 . . . Error correction circuit, 50, 51 and 52 . . . Multi-stage registers, 53 . . . Register, 54, 55 and 56 . . . Exclusive-addition circuits.

DESCRIPTION OF ILLUSTRATIVE EMBODIMENTS

Figure 1:
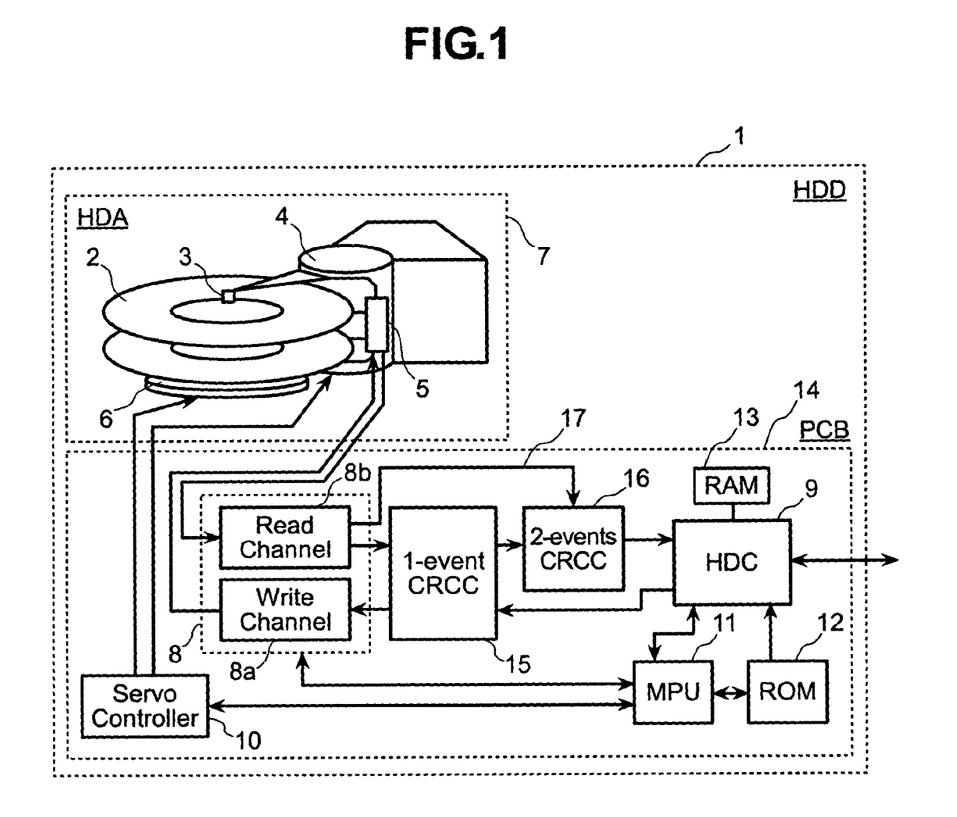
FIG. 1 is a diagram showing the configuration of a magnetic disc apparatus implemented by an embodiment of the present invention.

By referring to FIG. 1, the following description explains a first embodiment, which applies the present invention to signal processing carried out by a magnetic disc apparatus. A magnetic-disc apparatus (HDD) 1 comprises a head/disc assembly (HDA) 7 and a package board (PCB) 14. The HDA 7 includes a magnetic disc 2, a spindle motor 6, a magnetic head 3, a carriage 4 and a R/W-IC 5. The magnetic disc 2 is mounted on the spindle motor 6 for rotating the magnetic disc 2. The carriage 4 supports the magnetic head 3 and positions the magnetic head 3 at any arbitrary radial location of the magnetic disc 2. The R/W-IC 5 is attached to the carriage 4. The PCB 14 has read/write channels 8, a 1-event CRCC correction circuit 15, a 2-event CRCC correction circuit 16, a hard disc controller (HDC) 9, a servo control circuit 10, a microprocessor (MPU) 11, a ROM 12 and a RAM 13.

The read/write channels 8 comprise a write channel 8a for recording data and a read channel 8b for reproducing data. A signal-processing technology adopted by the read channel 8b is based on a PRML (2, 1, −1, −1, −1) technique. An in-surface recording technique is adopted as a magnetic recording technique with the line recording density set at a standardized line density of 2.75.

The HDC 9 supplies recording data to the 1-event CRCC correction circuit 15 provided for correcting a 1-event error. The recording data is subjected to a CRCC encoding process in the 1-event CRCC correction circuit 15 before being recorded onto the magnetic disc 2 by way of the write channel 8a, the R/W-IC 5 and the magnetic head 3.

A reproduced signal is supplied to the read channel 8b by way of the magnetic head 3 and the R/W-IC 5. In the read channel 8b, the reproduced signal is demodulated, being converted into reproduced data. The reproduced data is supplied to the 1-event CRCC correction circuit 15 for correcting a 1-event error. An error that cannot be corrected as a 1-event error is supplied to the 2-event CRCC correction circuit 16 for correcting a 2-event error. The reproduced data with the 1-event errors and the 2-event errors corrected is supplied to the HDC 9.

The HDC 9 transmits the reproduced data with the 1-event errors and the 2-event errors corrected to a host apparatus such as a computer. The MPU 11 is a component for controlling all other components employed in the HDD 1. The servo control circuit 10 is a component for controlling the rotation of the spindle motor 6 and the positioning of the magnetic head 3 under control executed by the MPU 11. The ROM 12 is a memory for storing programs of the MPU 11 and programs of the HDC 9. On the other hand, the RAM 13 serves as a buffer for storing data to be recorded and reproduced data.

Figure 3:
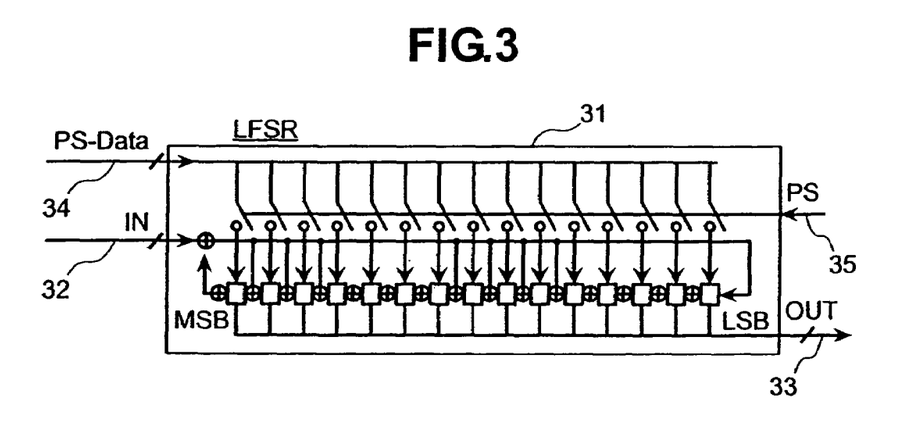
FIG. 3 is a diagram showing the configuration of a linear feedback shift register (LFSR).

In order to carry out a CRCC encoding process, division by a generating function in an LFSR (Linear Feedback Shift Register) 31 shown in FIG. 3 is implemented. The generating function uses a coefficient notation of 1111000111100001 from the inside of a 15th-order primitive polynomial. In the LFSR 31, a register corresponding to a coefficient bit of 1 in the generating function is wired by using an exclusive-addition circuit. By controlling a preset terminal (PS) 35, '000000000000000' is preset as preset data 34. Hereafter, notation 'zero' is used for representing '000000000000000'. When data 32 is supplied to an IN terminal on the MSB side after the preset data 34 is preset, a result of a division appears in each register at the point of time all data is input. The results of division are output from an OUT terminal as CRC data 33 of 15 bits. The CRC data 33 is added to the input data to generate encoded data. In this embodiment, the recording data completing the CRCC encoding process has a length of 100 bits.

Figure 4:
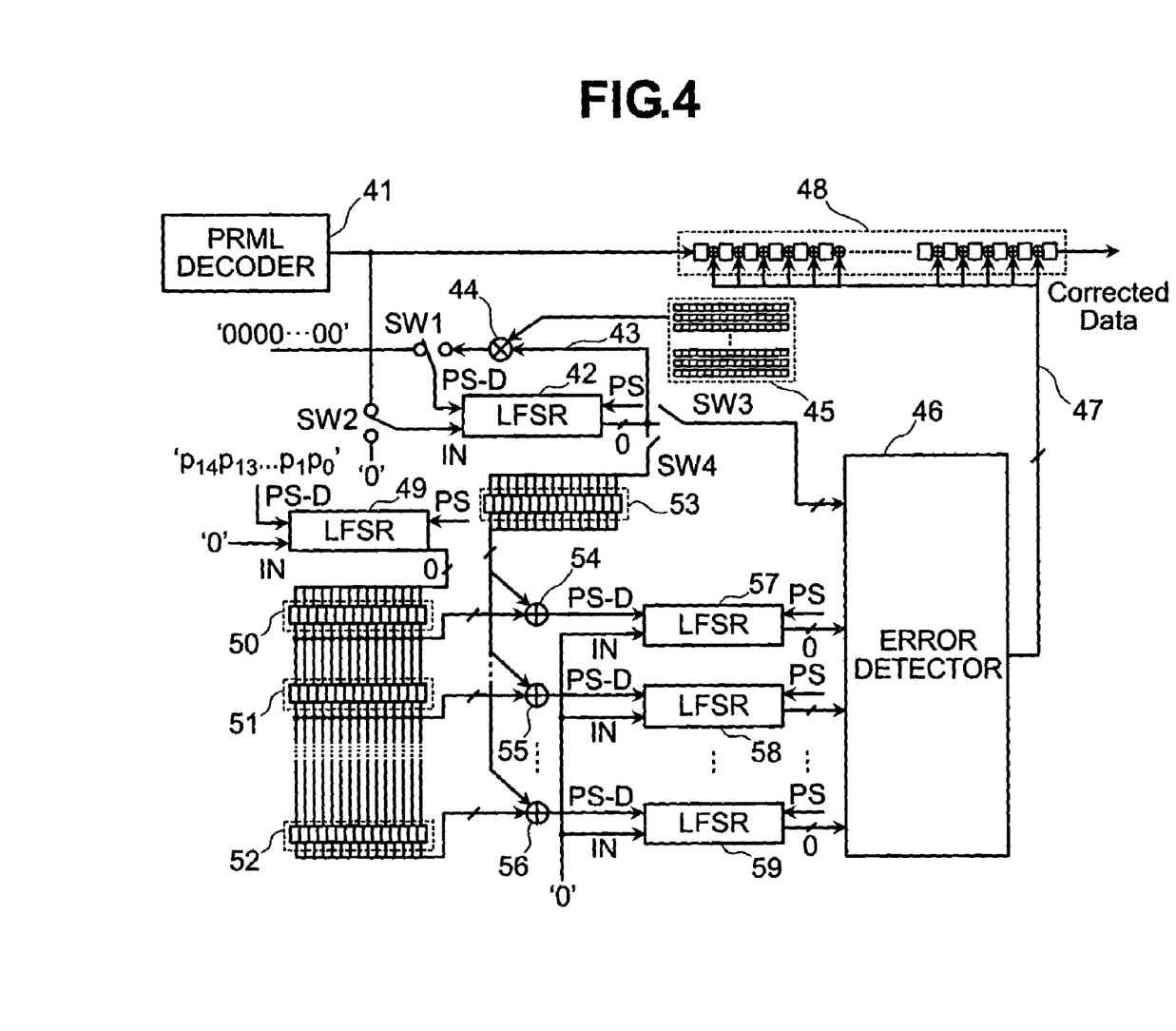
FIG. 4 is a diagram showing the configuration of an error correction circuit for correcting 1-event and 2-event errors in accordance with an embodiment of the present invention.

Referring to FIG. 4, the following description explains concrete processes carried out by the 1-event CRCC correction circuit 15 and the 2-event CRCC correction circuit 16 to correct errors. For the sake of convenience of the description, FIG. 4 shows a circuit representing both the 1-event CRCC correction circuit 15 and the 2-event CRCC correction circuit 16. In addition, in this embodiment, by a 1-event error to be corrected, two types of error, that is, a 3-consecutive-bit error and a 5-consecutive-bit error, are implied. The basis for this implication is that a result of a survey based on a simulation of distribution of error events for a magnetic recording channel dominated by white noises indicates that the 3-consecutive-bit errors and the 5-consecutive-bit errors occupy respectively 95% and 1% of all the error events. For the same reason, the correction of a 2-event error is limited to correction of very frequently generated 3-consecutive-bit errors that occur at two locations in the reproduced data. In addition, in the case of this embodiment, the reproduced data has a small length of 100 bits. Thus, an error event is stretched over a boundary at a relatively high frequency. Considering this fact, a 3-consecutive-bit error or a 5-consecutive-bit error stretched over a boundary is corrected by adoption of a pattern-matching technique.

'Zero' is preset in each register from a switch SW1 by way of a preset input terminal PS of the LFSR 42 as preset data PS-D. Then, a reproduced data sequence output from a PRML demodulator 41 provided in the read channel 8b is supplied to an IN terminal of the LFSR 42 by way of a switch SW2. At a point of time the reproduced data with a length of 100 bits is input, CRC data 43 is output. If the CRC data 43 is 'zero', no error is determined to have been generated. If the CRC data 43 is not 'zero', on the other hand, an error is determined to have been obviously generated. In this case, an attempt is made to detect a 1-event error or a 2-event error to be described hereunder.

In order to detect a 1-event error, a cyclic-replacement process for the CRC data 43 is repeated to make a shift to the position of the LSB of the CRC data 43 generated in the reproduced data. The CRCC period used in this embodiment is $(2^{15}-1=)$ 32,767 bits. Thus, in order to detect an error event generated in the reproduced data encoded into 100 bits, the cyclic-replacement process must be repeated 32,682 (32,767−(100−15)) times in advance. A method of carrying out this process in a real-time manner is described in Japanese Published Application No. 2000-57709 (Pages 3 to 4 and FIGS. 1 and 5). First of all, an operation to carry out the cyclic-replacement process once is expressed in terms of a base matrix consisting of 15 rows and 15 columns. Then, a beta matrix 45 is computed in advance. A beta matrix 45 is a matrix obtained as a result of multiplying the base matrixes 32,682 times. Since an element of the beta matrix 45 is either 0 or 1, the values of the elements can be stored in a register with ease. A multiplier 44 then multiplies the beta matrix 45 by the CRC data 43 to produce CRC data obtained after carrying out the cyclic-replacement process 32,682 times. The CRC data is preset in the LFSR 42 by way of the switch SW1, and a switch SW3 is closed to supply the CRC data to an error detection circuit 46.

The error detection circuit 46 compares the CRC data with the error event to be corrected to determine whether or not the CRC data matches the error event. At that time, if the CRC data matches a 3-consecutive-bit error, for example, the error detection circuit 46 stores a record of a 3-consecutive-bit error detected at the cyclic-replacement process carried out 0 times. If the CRC data does not match the error event, on the other hand, the state of the switch SW2 is changed over to supply 'zero' to the IN terminal of the LFSR 42 for a cyclic-replacement process. The resulting CRC data is then supplied to the error detection circuit 46 to repeat the pattern-matching process. The detected error event is stored along with the number of times the cyclic-replacement process has been repeated till the CRC data 43 matches the error event to be corrected as described above. It is to be noted that, if the CRC data 43 does not match the error event to be corrected even after the cyclic-replacement process has been carried out repeatedly 100 times, no correctable 1-event error is determined to have been generated.

A 2-event error is detected by concurrently carrying out 2 processes, that is, a process to tentatively correct a 1-event error at a first location and a process to detect a 2-event error at a second location. The tentative-correction process computes all pieces of CRC data for a 3-consecutive-bit error generated at any location in the reproduced data. Now, assume a data sequence in which a 3-consecutive-bit error is generated at the LSB of the reproduced data and, for other locations, the CRC data 43 is data 'zero'. The data sequence is divided by the generating function and multiplied by the beta matrix 45 to compute CRC data in advance. Let notation $p_{14}p_{13}$ - - - $p_1p_0$ denote the CRC data. The CRC data is preset in the LFSR 49. The preset CRC data $p_{14}p_{13}$ - - - $p_1p_0$ is supplied to a multi-stage register 50. Later on, the data 'zero' is supplied to the IN terminal of the LFSR 49 and a cyclic-replacement process is carried out once. This cyclic-replacement process outputs new CRC data from the OUT terminal of the LFSR 49 and supplies the CRC data to a stage register 50. At the same time, the CRC data existing in the stage register 50 is supplied to a stage register 51. As a result of repeating this operation, the initial CRC data $p_{14}p_{13}$ - - - $p_1p_0$ is shifted to a stage register 52. Eventually, 97 pieces of CRC data are stored in the stage registers, from the stage register 50 to the stage register 52.

In order to make the verification easy, these pieces of CRC data are CRC data for 3-bit errors generated from the MSB to the LSB of the reproduced data. These pieces of data are subjected to an exclusive-added process for exclusively adding the pieces of data to CRC data found from the reproduced data in order to generate CRC data obtained after virtually carrying out tentative-correction processing based on a strict criterion. It is to be noted that these pieces of CRC data can also be computed every time CRC data of the reproduced data is calculated or these pieces of CRC data can also be stored in advance as fixed values in a register if there is a margin.

By closing a switch SW4, the CRC data computed from the reproduced data (after the multiplication of the beta matrix) is stored in a register 53. Exclusive-addition circuits 54, 55, - - - and 56 carry out exclusive-addition processes for exclusively adding the pieces of CRC data stored in the multi-stage registers 50, 51, - - - and 52 to the CRC data stored in the register 53 and preset results of the exclusive-addition in LFSRs 57, 58, - - - and 59 respectively.

At the same time, the pieces of CRC data are supplied to the error detection circuit 46 by way of the OUT terminals of their respective LFSRs 57, 58, - - - and 59. By executing the same procedure as the detection of a 1-event error, pieces of data 'zero' are supplied to the IN terminals of the LFSRs 57, 58, - - - and 59 to repeat the cyclic-replacement process.

When a 3-consecutive-bit error is detected for the first time for a piece of CRC data stored in any of the LFSRs 57, 58, - - - and 59, the error detection circuit 46 stores the number of times the cyclic replacement has been carried out to detect the error and the location of the tentatively corrected error. In this embodiment, error events are limited to a 3-consecutive-bit error. Thus, it is not necessary to store the type of error. The location of an error completing a tentative-correction process can be determined by identifying which LFSR has output the CRC data leading to the detection of the error. Assume for example that the LSFR 58 outputs the CRC data leading to the detection of the error. In this case, by going upstream till the multi-stage registers 50, 51, - - - and 52, a position obtained as a result of shifting from the MSB (Most Significant Bit) to the LSB (Least Significant Bit) side by 1 bit is recognized as the location of the error completing a tentative-correction process.

The following description explains a procedure for correcting a detected 1-event error and a detected 2-event error. In parallel to the cyclic-replacement process, reproduced data is sequentially supplied to an error correction circuit 48. The error correction circuit 48 comprises a shift register having as many storage bits as required for the length of the reproduced data and exclusive-addition circuits each used for connecting any two successive ones of the storage bits of the shift registers. Each of the exclusive-addition circuits receives an error correction signal 47 from the error detection circuit 46. At times other than a time for correcting an error, the error correction signal 47 conveys the data 'zero'. At such times, the error correction circuit 48 functions merely as a shift register. When a correctable error is detected, the error detection circuit 46 enters a state of waiting for all the 100 bits of the reproduced data to be received by the error correction circuit 48. As all the 100 bits of the reproduced data are received by the error correction circuit 48, on the basis of the recorded number of times the cyclic replacement has been carried out and the recorded error event, data '1' is asserted on the error correction signal 47, which is output to the error correction circuit 48. As a result, the exclusive-addition circuits employed in the error correction circuit 48 invert the bits of the detected 1-event error and the detected 2-event error, completing the error correction process.

By the way, in the error correction process described above, a 1-event error and a 2-event error are detected at the same time in some cases. In such cases, it is impossible to determine whether the error is a 1-event error or a 2-event error on the basis of the CRC data as long as the error detection is concerned. In these cases, the error detection circuit 46 discards the results of error detection and prevents the error correction process from being carried out in accordance with the error detection.

Figure 5:
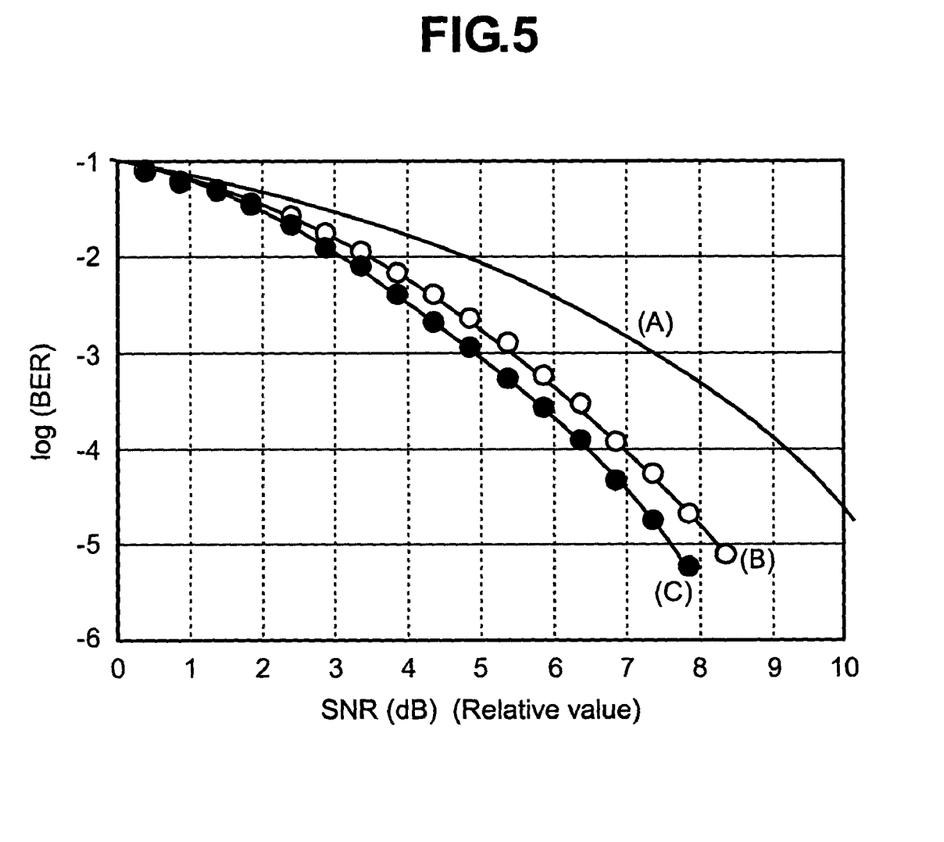
FIG. 5 is an explanatory diagram showing effects given by a first embodiment of the present invention.

FIG. 5 is a diagram showing results of a simulation simulating evaluation of the performance of error detection according to the first embodiment. The horizontal axis represents a relative signal-to-noise ratio SNR expressed in terms of dBs and the vertical axis represents a bit error rate Log expressed in terms of BERs. The SNR for a pre-error-correction bit error rate of $10^{-1}$ is 0 dB. Curve A is an SNR characteristic for bit error rates prior to error correction and curve B is an SNR characteristic for bit error rates with only a 1-event error corrected. On the other hand, curve C is an SNR characteristic for bit error rates with a 1-event error and a 2-event error corrected. In comparison with curve B for bit error rates with only a 1-event error corrected, it is obvious that the bit error rate is reduced by about 0.5 digits.

In this embodiment, a cyclic-replacement process and CRC-data processing using a linear feedback shift register are carried out as described above. The cyclic-replacement process and the processing of CRC data can be carried out concurrently in order to keep up with high-speed data transfers such as processes to transmit and receive parallel data having a size of 8 bits. By expanding the linear feedback shift register into a logic processing circuit, the concurrent processing can be carried out.

The beta matrix used in this embodiment is created by operating the cyclic replacement once. By using eight types of beta matrix, which represent the cyclic replacement carried out up to eight times, cyclic-replacement operations for parallel data having a size of 8 bits can be carried out concurrently by means of a logic processing circuit.

In addition, if CRC data for the MSB of the received data is computed in advance, pieces of CRC data for subsequent bits up to the LSB can be found from time to time by carrying out the inverse operation of the cyclic-replacement process. Thus, by using beta matrixes expressing the inverse cyclic replacement operation carried out eight times and using CRC data for 8 bits starting with the MSB as an initial value, pieces of CRC data for all subsequent bits up to the LSB can be found concurrently from time to time.

These pieces of CRC data are subjected to an exclusive-addition process only if the received data is '1' so that the same CRC data as that stored in the linear feedback shift register can be obtained. It is to be noted that a beta matrix expressing the inverse cyclic replacement operation carried out once and a beta matrix expressing the cyclic replacement operation carried out once are in a relation of mutually inverse matrixes.

Referring to FIGS. 1 to 4, the following description explains a second embodiment applying the present invention to signal processing carried out by a magnetic disc apparatus. In the case of the second embodiment, the length of the encoded data to be recorded is 561 bits. The encoding efficiency is improved to at least five times that of the first embodiment.

As shown in FIG. 1, a 1-event CRCC correction processing circuit 15 corrects a 1-event error. Since the correction is carried out in the same way as the first embodiment, its explanation is not repeated. An error that cannot be corrected as a 1-event error is corrected by using the 2-event CRCC correction circuit 16. In this case, a range for carrying out the tentative-correction process is defined by referring to reliability information 17.

A method of defining a range for carrying out the tentative-correction process by referring to information on reliability is explained by referring to FIG. 4. Since a concrete means for obtaining information on reliability is described in detail in Japanese Published Application No. 2000-134114 (Pages 6 to 9 and FIGS. 1, 4 and 5), the description of the means is omitted from this specification. A specific bit position is obtained and supplied to the 2-event CRCC correction circuit 16 as reliability information 17 shown in FIG. 1. At this specific bit position, it is quite within the bounds of possibility that a 3-consecutive-bit error to be tentatively corrected has been generated.

It is assumed that a 3-consecutive-bit error has been generated at one of 17 bit positions, that is, the bit position m specified in the reliability information 17, the 8 bit positions immediately preceding the bit position m and the 8 bit positions immediately succeeding the bit position m and each piece of CRC data is computed as follows: Seventeen multi-stage registers 50, 51, - - - and 52 shown in FIG. 4 are provided, and computation of CRC data from a preset value $p_{14}p_{13}$ - - - $p_1p_0$ is started. At a stage the computation of CRC data for bits up to bit position (m−8) is completed, the output operation of the LFSR 49 is stopped. At that time, the desired CRC data has been stored in the 17 registers cited above.

In addition, if a plurality of bit positions is used as candidates, a tentative-correction range excluding a location detected by the error detection circuit 46 needs to be specified. Assume for example that up to three bit positions are specified. In this case, 51 registers are provided. Control is executed so that, at bit positions of the specified range, the output of the LFSR 49 is turned on and, at other bit positions, the output is turned off. In this way, only the desired CRC data can be stored in the 51 registers.

The processes ranging from detection of a 1-event error and a 2-event error to their correction are the same as those of the first embodiment, making it unnecessary to repeat their explanations.

Figure 6:
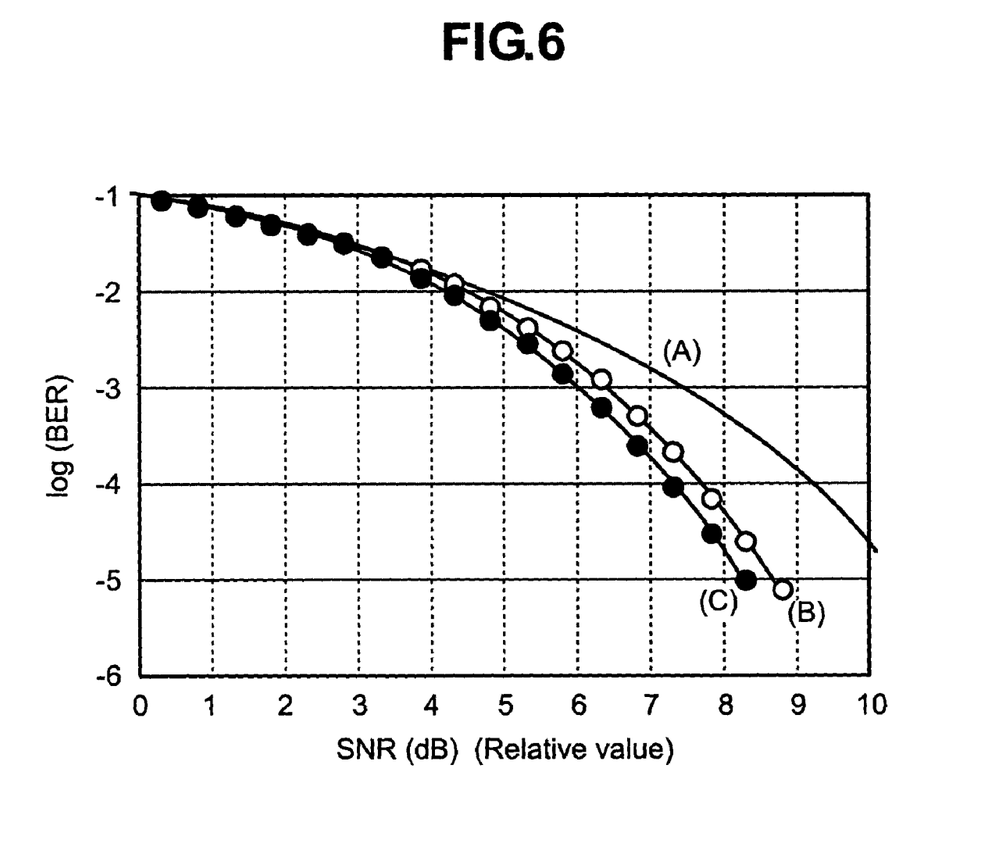
FIG. 6 is an explanatory diagram showing effects given by a second embodiment of the present invention.

FIG. 6 is a diagram showing results of a simulation simulating evaluation of the performance of error detection according to the second embodiment. The horizontal axis represents a relative signal-to-noise ratio SNR expressed in terms of dBs and the vertical axis represents a bit error rate. The SNR for a pre-error-correction bit error rate of $10^{-1}$ is 0 dB. Curve A is an SNR characteristic for bit error rates prior to error correction whereas curve B is an SNR characteristic for bit error rates with only a 1-event error corrected. On the other hand, curve C is an SNR characteristic for bit error rates with a 1-event error and a 2-event error corrected. In comparison with curve B for bit error rates with only a 1-event error corrected, it is obvious that the bit error rate is reduced by about 0.5 digits. It is to be noted that, in the simulation, the range of the tentative-correction is ±8 bits and a worst condition is assumed. In the worst condition, the tentative-correction position obtained from the reliability information 17 always has an offset of +4 bits. Even under such a condition, in accordance with the correction of a 2-event error according to the present invention, there is exhibited an effect of a low bit error rate in comparison with the correction of only a 1-event error.

In the first and second embodiments described so far, a magnetic recording channel dominated by white noises is taken as an example. However, the scope of the present invention is not limited to the white noises only, but it is applicable to other noises. As an example, in the case of dominating position jitter noises caused by random displacements of the position of a magnetization transition point, the 1-consecutive-bit errors and the 2-consecutive-bit errors occupy respectively 95% and 3% of all the error events. Thus, the 1-consecutive-bit 1-event errors, the 2-consecutive-bit 1-event errors and the 1-consecutive-bit 2-event errors are errors to be corrected.

In addition, in an actual magnetic recording channel, white noises and position jitter noises are mixed with each other at a variety of mixing ratios. If the present invention is applied to such a condition of noises, it is desirable to provide a learning function to select an optimum error event among error events including 1-consecutive-bit, 2-consecutive-bit, 3-consecutive-bit, 4-consecutive-bit and 5-consecutive-bit errors. In order to implement this learning function, it is necessary to provide a processing mode for carrying out only a process to correct 1-event errors, to find the event frequency of each error actually corrected in this processing mode and to select 1-event errors and 2-event errors starting with errors having high event frequencies as errors to be corrected.

Furthermore, with regard to 3-event and more-event errors, pieces of CRC data generated by the LFSR 49 for 1-event errors are all combined to give CRC data obtained after the tentative-correction. It is possible to implement a configuration in which, on the basis of this CRC data, the error detection circuit 46 detects an error and the error correction circuit 48 corrects the error in the same way as the first and second embodiments.

In accordance with the present invention described above, a tentative-correction process based on a strict criterion is added to the conventional CRCC correction system for 1-event errors so as to allow a 2-event error to be corrected on the basis of a strict criterion.

What is claimed is:

1. An error correction method for correcting an error event generated at one or more locations in received data by using a cyclic code, said error correction method comprising the steps of:
   carrying out an exclusive-addition process of remainder data obtained as a result of dividing said received data by a generating function to remainder data obtained as a result of dividing data including an error event virtually generated in said received data by a generating function in order to find remainder data generated after a tentative-correction process for said virtually generated error event, wherein said virtually generated error event is specified by a distribution of error events obtained in a process for demodulating said received data; and
   correcting said error event of said tentative-correction process and an error event generated at a second location in said received data when said error event generated at said second location can be detected on the basis of said remainder data generated after said tentative-correction process.

2. An error correction method comprising the steps of:
   carrying out a cyclic-replacement process on remainder data obtained as a result of dividing received data by a generating function in order to check whether or not a 1-event error is an event of an error to be corrected when generation of said 1-event error in said received data is detected on the basis of said remainder data, wherein said 1-event error is detected in a set of error event specified by a distribution of error events obtained in a process for demodulating said received data;
   if said 1-event error is determined to be an event of an error to be corrected, correcting said 1-event error in said received data on the basis of the number of times said cyclic-replacement process has been carried out and on the basis of said error event;
   if said 1-event error is determined to be an event of an uncorrectable error, carrying out an exclusive-addition process of remainder data obtained as a result of dividing said received data by a generating function to remainder data obtained as a result of dividing data including an error event virtually generated in said received data by a generating function in order to find remainder data generated after a tentative-correction process for said virtually generated error event, wherein said virtually generated error event is specified by a distribution of error events obtained in a process for demodulating said received data; and
   correcting said error event of said tentative-correction process and an error event generated at a second location in said received data when said error event generated at said second location can be detected on the basis of said remainder data generated after said tentative-correction process.

3. An error correction method according to claim 1 or 2, wherein a range of said tentative-correction process is specified by using reliability information obtained in a process to demodulate said received data.

4. An error correction circuit comprising:
   a 1-event-error correction circuit for correcting a 1-event error of post-demodulation reproduced data, wherein the 1-event error is specified by a distribution of error events obtained in the post-demodulation reproduced data; and
   a 2-event-error correction circuit for receiving an output of said 1-event-error correction circuit and correcting a 2-event error, which cannot be corrected by said 1-event-error correction circuit, wherein the 2-event error is specified by a distribution of error events obtained in the post-demodulation reproduced data.

5. An error correction circuit comprising:
   a first linear feedback shift register for carrying out a cyclic-replacement process on remainder data obtained as a result of dividing received data by a generating function;
   a second linear feedback shift register for receiving input data obtained as a result of said cyclic-replacement process carried out on remainder data obtained as a result of dividing data including an error event virtually generated in said received data by a generating function and for carrying out a cyclic-replacement process on said input data;

a multi-stage register for receiving data output by said second linear feedback shift register and sequentially transferring said data from stage to stage;

a plurality of exclusive-addition circuits for carrying out an exclusive-addition process of remainder data output by said first linear feedback shift register to each of outputs of said multi-stage register in order to virtually perform a tentative-correction process on said received data;

a plurality of third linear feedback shift registers each used for receiving each of said outputs of said exclusive-addition circuits and carrying out a cyclic-replacement process on said received outputs;

an error detection circuit for:
receiving remainder data obtained as a result of said cyclic-replacement process carried out by said first linear feedback shift register and checking said remainder data in order to determine whether or not a detected error can be corrected as a 1-event error;

if said detected error is determined to be correctable as a 1-event error, outputting a first error correction signal based on the number of times said cyclic-replacement process required for detection of said detected error has been carried out and based on an error event of said detected error in order to input remainder data obtained as a result of said cyclic-replacement process carried out by said third linear feedback shift registers and checking said remainder data in order to determine whether or not said detected error is an error event to be corrected; and if said detected error is determined to be an error event to be corrected, outputting a second error correction signal based on the number of times said cyclic-replacement process required for detection of said detected error has been carried out and based on an error event completing said tentative-correction process; and an error correction circuit for receiving said received date and, when said first and second error correction signals are received from said error detection circuit, correcting said received data.

6. An error correction circuit according to claim 5, wherein a range of said tentative-correction process carried out by said second linear feedback shift register and said multi-stage register is specified by using reliability information obtained in a process to demodulate said received data.

7. An information-recording/reproduction apparatus comprising:
a recording medium;
a head for recording data onto said recording medium and reproducing data from said recording medium;
a read/write channel for modulating data supplied to said head to be recorded by said head and demodulating a reproduced signal read out by said head;
a 1-event-error correction circuit for outputting data to be recorded obtained as a result of adding a cyclic code to data to be recorded onto said recording medium to said read/write channel and for correcting a 1-event error of reproduced data demodulated by said read/write channel;

a 2-event-error correction circuit for receiving an output of said 1-event-error correction circuit and correcting a 2-event error that cannot be corrected by said 1-event-error correction circuit;

a control circuit for receiving an output of said 2-event-error correction circuit and controlling a transfer of said output of said 2-event-error correction circuit to a host apparatus as reproduced data; and a processor for controlling said recording medium, said head, said read/write channel, said 1-event-error correction circuit, said 2-event-error correction circuit and said control circuit.

8. An information-recording/reproduction apparatus comprising:
a recording medium;
a head for recording data onto said recording medium and reproducing data from said recording medium;
a read/write channel for modulating data supplied to said head to be recorded by said head and demodulating a reproduced signal read out by said head;
a first linear feedback shift register for providing said read/write channel with recording data obtained as a result of adding a cyclic code to data to be recorded onto said recording medium and for carrying out a cyclic-replacement process on remainder data obtained as a result of dividing reproduced data, which is received from said read/write channel after being demodulated by said read/write channel, by a generating function;

a second linear feedback shift register for receiving input data obtained as a result of said cyclic-replacement process carried out on remainder data obtained as a result of dividing data including an error event virtually generated in said reproduced data by a generating function and for carrying out a cyclic-replacement process on said input data;

a multi-stage register for receiving data output by said second linear feedback shift register and sequentially transferring said data from stage to stage;

a plurality of exclusive-addition circuits for carrying out an exclusive-addition process of remainder data output by said first linear feedback shift register to each of outputs of said multi-stage register in order to virtually perform a tentative-correction process on said received data;

a plurality of third linear feedback shift registers each used for receiving each of said outputs of said exclusive-addition circuits and carrying out a cyclic-replacement process on said received outputs;

an error detection circuit for:
receiving remainder data obtained as a result of said cyclic-replacement process carried out by said first linear feedback shift register and checking said remainder data in order to determine whether or not a detected error can be corrected as a 1-event error;

if said detected error is determined to be correctable as a 1-event error, outputting a first error correction signal based on the number of times said cyclic-replacement process required for detection of said detected error has been carried out and based on an error event of said detected error in order to input remainder data obtained as a result of said cyclic-replacement process carried out by said third linear feedback shift registers and checking said remainder data in order to determine whether or not said detected error is an error event to be corrected; and if said detected error is determined to be an error event to be corrected, outputting a second error correction signal based on the number of times said cyclic-replacement process required for detection of said detected error has been carried out and based on an error event completing said tentative-correction process;

an error correction circuit for correcting said reproduced data when said first and second error correction signals are received from said error detection circuit;

a control circuit for receiving an output of said error correction circuit and controlling a transfer of said output of said error correction circuit to a host apparatus as reproduced data; and a processor for controlling said recording medium, said head, said read/write channel, said first linear feedback shift register, said second linear feedback shift register, said multi-stage register, said exclusive-addition circuits, said third linear feedback shift registers, said error detection circuit, said error correction circuit and said control circuit.

9. An information-recording/reproduction apparatus according to claim 8, wherein a range of said tentative-correction process carried out by said second linear feedback shift register and said multi-stage register is specified by using reliability information obtained in a process to demodulate said received data.

* * * * *